US012553119B2

(12) United States Patent
Silberberg et al.

(10) Patent No.: US 12,553,119 B2
(45) Date of Patent: Feb. 17, 2026

(54) VACUUM DEPOSITION FACILITY AND METHOD FOR COATING A SUBSTRATE

(71) Applicant: ArcelorMittal, Luxembourg (LU)

(72) Inventors: Eric Silberberg, Haltinne (BE); Sergio Pace, Jodoigne (BE); Remy Bonnemann, Saint-Nicolas (BE)

(73) Assignee: ArcelorMittal, Luxembourg (LU)

( * ) Notice: Subject to any disclaimer, the term of this patent is extended or adjusted under 35 U.S.C. 154(b) by 12 days.

(21) Appl. No.: 18/807,440

(22) Filed: Aug. 16, 2024

(65) Prior Publication Data

US 2024/0401183 A1 Dec. 5, 2024

Related U.S. Application Data

(62) Division of application No. 16/973,097, filed as application No. PCT/IB2019/053337 on Apr. 23, 2019, now Pat. No. 12,091,739.

(30) Foreign Application Priority Data

Jun. 13, 2018 (WO) .................. PCT/IB2018/054297

(51) Int. Cl.
*C23C 14/04* (2006.01)
*C23C 14/16* (2006.01)
*C23C 14/24* (2006.01)
*C23C 14/56* (2006.01)

(52) U.S. Cl.
CPC .............. *C23C 14/04* (2013.01); *C23C 14/16* (2013.01); *C23C 14/24* (2013.01); *C23C 14/562* (2013.01)

(58) Field of Classification Search
CPC ......... C23C 14/04; C23C 14/16; C23C 14/24; C23C 14/562; C23C 14/225; C23C 14/228; C23C 14/568; C23C 14/243; C23C 14/34
See application file for complete search history.

(56) References Cited

U.S. PATENT DOCUMENTS

| | | | | |
|---|---|---|---|---|
| 4,960,607 | A | 10/1990 | Neuman et al. | |
| 5,608,083 | A | 3/1997 | Fuderer | |
| 5,803,976 | A * | 9/1998 | Baxter .................. C23C 14/243 | 118/726 |
| 6,202,591 | B1 | 3/2001 | Witzman et al. | |
| 6,471,798 | B1 | 10/2002 | Oishi et al. | |
| 7,220,450 | B2 | 5/2007 | Schade Van Westrum et al. | |
| 8,481,120 | B2 | 7/2013 | Choquet et al. | |
| 9,045,819 | B2 | 6/2015 | Honda et al. | |
| 2004/0022942 | A1 | 2/2004 | Schade van Westrum et al. | |
| 2004/0154539 | A1 | 8/2004 | Feldbauer et al. | |
| 2007/0128344 | A1 | 6/2007 | Marriott et al. | |
| 2008/0245300 | A1* | 10/2008 | Kuper ..................... C23C 14/24 | 118/724 |

(Continued)

FOREIGN PATENT DOCUMENTS

| | | | |
|---|---|---|---|
| CA | 2316669 | A1 | 2/2001 |
| CN | 87105737 | A | 5/1988 |

(Continued)

*Primary Examiner* — Michael G Miller
(74) *Attorney, Agent, or Firm* — Davidson Kappel LLC

(57) ABSTRACT

A coated substrate obtainable by a method for continuously depositing, on a running substrate, coatings formed from at least one metal inside a vacuum deposition facility including a vacuum chamber. A vacuum deposition facility for producing such coated substrates.

10 Claims, 3 Drawing Sheets

(56) References Cited

U.S. PATENT DOCUMENTS

| | | | |
|---|---|---|---|
| 2010/0104752 | A1 | 4/2010 | Choquet et al. |
| 2011/0000431 | A1* | 1/2011 | Banaszak .............. C23C 14/562 118/694 |
| 2011/0081486 | A1 | 4/2011 | McCamy et al. |
| 2011/0281031 | A1 | 11/2011 | Silberberg et al. |
| 2012/0070928 | A1 | 3/2012 | Kim et al. |
| 2017/0114427 | A1 | 4/2017 | Li et al. |
| 2021/0230736 | A1 | 7/2021 | Silberberg et al. |
| 2021/0238735 | A1 | 8/2021 | Silberberg et al. |
| 2021/0254190 | A1 | 8/2021 | O'Connell et al. |

FOREIGN PATENT DOCUMENTS

| | | | |
|---|---|---|---|
| CN | 1458985 | A | 11/2003 |
| CN | 1875128 | | 12/2006 |
| CN | 203823748 | U | 9/2014 |
| CN | 107723663 | A | 2/2018 |
| DE | 102010040044 | A1 | 3/2012 |
| DE | 10 2013206598 | A1 | 10/2014 |
| EP | 0262324 | A1 | 4/1988 |
| EP | 0410501 | A1 | 1/1991 |
| EP | 0909342 | B1 | 8/2004 |
| EP | 1 972699 | A1 | 9/2008 |
| EP | 2048261 | | 4/2009 |
| EP | 2129811 | B1 | 8/2013 |
| EP | 2940191 | | 11/2015 |
| EP | 3369839 | B1 | 10/2020 |
| JP | S5240413 | A | 3/1977 |
| JP | S61284565 | A | 12/1986 |
| JP | S 6296669 | A | 5/1987 |
| JP | S62151528 | A | 7/1987 |
| JP | S62230932 | A | 10/1987 |
| JP | S6326351 | | 2/1988 |
| JP | S6326351 | A | 2/1988 |
| JP | S63100124 | A | 5/1988 |
| JP | S63105920 | A | 5/1988 |
| JP | H01233049 | A | 9/1989 |
| JP | H024963 | A | 1/1990 |
| JP | H04160159 | A | 6/1992 |
| JP | H06136537 | A | 5/1994 |
| JP | H06212424 | A | 8/1994 |
| JP | 2004311065 | A | 11/2004 |
| JP | 2007262540 | | 10/2007 |
| JP | 2010522272 | A | 7/2010 |
| JP | 2011503344 | A | 1/2011 |
| JP | 2012512959 | A | 6/2012 |
| JP | 2013-506761 | A | 2/2013 |
| JP | 2014132102 | A | 7/2014 |
| JP | 2018031076 | A | 3/2018 |
| KR | 0180725 | B1 | 2/1999 |
| WO | WO8102585 | A | 9/1981 |
| WO | WO97/47782 | | 12/1997 |
| WO | WO2005042797 | A1 | 5/2005 |
| WO | WO2008/064894 | | 8/2008 |
| WO | WO2010067603 | A1 | 6/2010 |
| WO | WO2017073894 | A1 | 5/2017 |
| WO | WO 2019/239229 | A1 | 12/2019 |
| WO | WO2019239228 | A1 | 12/2019 |

* cited by examiner

VACUUM DEPOSITION FACILITY AND METHOD FOR COATING A SUBSTRATE

This is a divisional of U.S. Ser. No. 16/973,097 filed on Dec. 8, 2020, published as US 2021/0254205 A1, which is a National Phase of PCT/IB2019/053337, filed on Apr. 23, 2019, which claims priority to International Patent Application PCT/IB2018/054297 which was filed on Jun. 13, 2018. All of the above are hereby incorporated by reference herein.

The present invention relates to a method for continuously depositing, on a substrate, coatings formed from metal or metal alloys. The present invention also relates to a vacuum deposition facility used in this method.

BACKGROUND

Various processes for depositing metal coatings, eventually composed of alloys, on a substrate, such as a steel strip, are known. Among these, mention may be made of hot-dip coating, electrodeposition and also the various vacuum deposition processes, such as vacuum evaporation and magnetron sputtering.

It is known from WO97/47782 a method for the continuous coating of a steel substrate in which a metallic vapor spray, propelled at a speed greater than 500 m/s, comes in contact with the substrate. The deposition method is called jet vapor deposition.

EP2048261 discloses a vapor generator for depositing a coating on a metallic substrate, and comprises a vacuum chamber in the form of an enclosure provided with a unit to ensure a state of depression with respect to the external environment and a unit allowing entry and exit of the substrate. The enclosure comprises a head for vapor deposition, and an ejector for creating a metal vapor jet at the sonic speed in the direction of and perpendicular to the substrate surface. The ejector is connected with a crucible by a supply pipe. The crucible contains a mixture of metals in liquid form, and is located outside the vacuum chamber and fed by pumping or by barometric effect of the melt obtained from a melting furnace placed at atmospheric pressure. A unit is arranged to regulate flow, pressure and/or speed of the metal vapor in the ejector. The regulation unit comprises a butterfly type proportional valve and/or a pressure drop device arranged in the pipe. The ejector comprises a longitudinal slit as sonic collar for vapor exit extending on the whole width of the substrate, and a sintered filter medium or a pressure loss body for standardizing and correcting the velocity of the vapor exiting from the ejector.

In EP2048261, preferably, the generator comprises a means for adjusting the length of the longitudinal slit of the ejector to the width of the substrate. In particular, a simple system for adjusting the vapor jet slot to the width of the strip by rotation of the ejector around its axis is disclosed. Thus, the edges of the vapor jet and the edges of the substrate are in same plans, i.e. the distances between edges of the vapor jet and the edges of the substrate are equal to 0 mm.

BRIEF SUMMARY OF THE INVENTION

Nevertheless, when metal vapors must be deposited on only one side of the strip, it has been observed that these vapors tend also to deposit and therefore contaminate the opposite side of the strip causing a significant decrease of the deposition yield and the surface aspect of the opposite side strip.

It is an object of the present invention to provide a method for depositing coatings on a running substrate wherein when metal vapors have to be deposited on only one side of the strip, the accumulation of metal on the opposite naked side of the strip is significantly low.

The present invention provides a method for continuously depositing, on a running substrate (S), coatings formed from at least one metal inside a Vacuum deposition facility (1) comprising a vacuum chamber (2), wherein the method comprises:

- A step in which in the said vacuum chamber, a metallic vapor is ejected through at least one vapor ejector (3), towards one side of the running substrate (S1) and a layer of at least one metal is formed on said side by condensation of ejected vapor, the at least one vapor ejector being positioned with an angle α between the vapor ejector and the axis (A) perpendicular to the running direction of the substrate, the axis being in the plane of the substrate, α satisfying the following equation:

$$(D1+D2)+Le\ \sin\alpha+We\ \cos\alpha=Ws,$$

α being in absolute value above 0°,
- D1 and D2 being the lower distance between the ejector and each substrate edges along the axis (A), $W_s$ being the substrate width, D1 and D2 being above 0 mm, i.e. the ejector edges do not go beyond the substrate edges, said vapor ejector having an elongated shape and comprising a slot and being defined by a slot length Le and a slot width We.

The invention also covers a coated substrate.

The invention also covers a vacuum facility.

BRIEF DESCRIPTION OF THE DRAWINGS

To illustrate the invention, various embodiments and trials of non-limiting examples will be described, particularly with reference to the following Figure.

DETAILED DESCRIPTION

Other characteristics and advantages of the invention will become apparent from the following detailed description of the invention.

The invention relates to a method for continuously depositing, on a running substrate, coatings formed from at least one metal inside a Vacuum deposition facility, wherein the method comprises:

- A step in which metallic vapor is ejected through at least one vapor ejector, towards one side of the running substrate S1 and a layer of at least one metal is formed on said side by condensation of ejected vapor, the at least one vapor ejector being positioned with an angle α between the vapor ejector and the axis A perpendicular to the running direction of the substrate, the axis being in the plane of the substrate, α satisfying the following equation:

$$(D1+D2)+Le\sin\alpha+We\cos\alpha=Ws,$$

α in absolute value is above 0°,

D1 and D2 being the distance between the ejector and each substrate edges along the axis A, $W_s$ being the substrate width, D1 and D2 being above 0 mm and said vapor ejector having an elongated shape and comprising a slot and being defined by a slot length Le and a slot width We.

Without willing to be bound by any theory, it is believed that with the method according to the present invention, it is possible to avoid the contamination of metal vapors on the opposite side of the metallic substrate S2. Indeed, the inventors have found that the vapor ejector has to be positioned with a specific angle α so that the metal vapor is ejected almost without any lost. When α satisfies the equation, the yield of the metal vapor deposited on one side of the running substrate is highly improved since the trajectory of the metal vapor is controlled. Thus, the accumulation of metal vapors on the opposite side of the substrate is significantly low.

Figure 1:
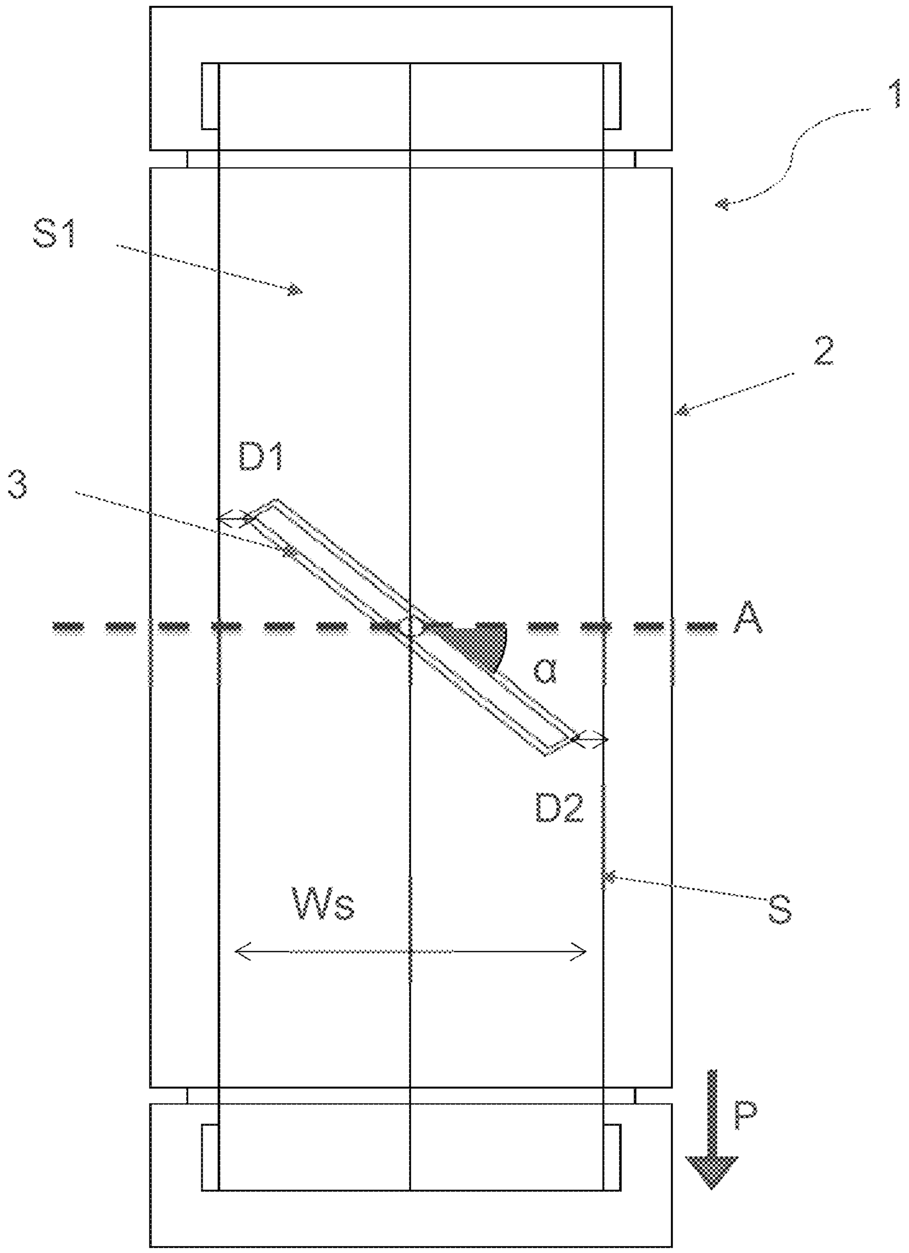
FIG. 1 illustrates a top view of a substrate coated with at least one vapor ejector inside a vacuum deposition facility according to the present invention.

With reference to FIG. 1, the facility 1 according to the invention first comprises a vacuum chamber 2 and a means for running the substrate through the chamber. This vacuum chamber 2 is a hermetically-sealable box preferably kept at a pressure of between $10^{-8}$ and $10^{-3}$ bar. It has an entry lock and an exit lock (these not being shown) between which a substrate S, such as for example a steel strip, can run along a given path P in a running direction.

The at least one vapor ejector 3 ejects metallic vapor at sonic speed on one side of the running substrate S1. The at least one vapor ejector is positioned with an angle α between the vapor ejector and the axis A perpendicular to the running direction of the substrate, the axis being in the plane of the substrate, α satisfying the following equation:

$$(D1+D2)+Le\sin\alpha+We\cos\alpha=Ws.$$

The ejector can have different shapes, such as a rectangular shape or a trapezoidal shape. Different distances values of D1 and D2 are possible as illustrated in FIG. 1. Preferably, D1 and D2 represents the lowest distance between the ejector edges and the substrate edges along the axis A.

Figure 2:
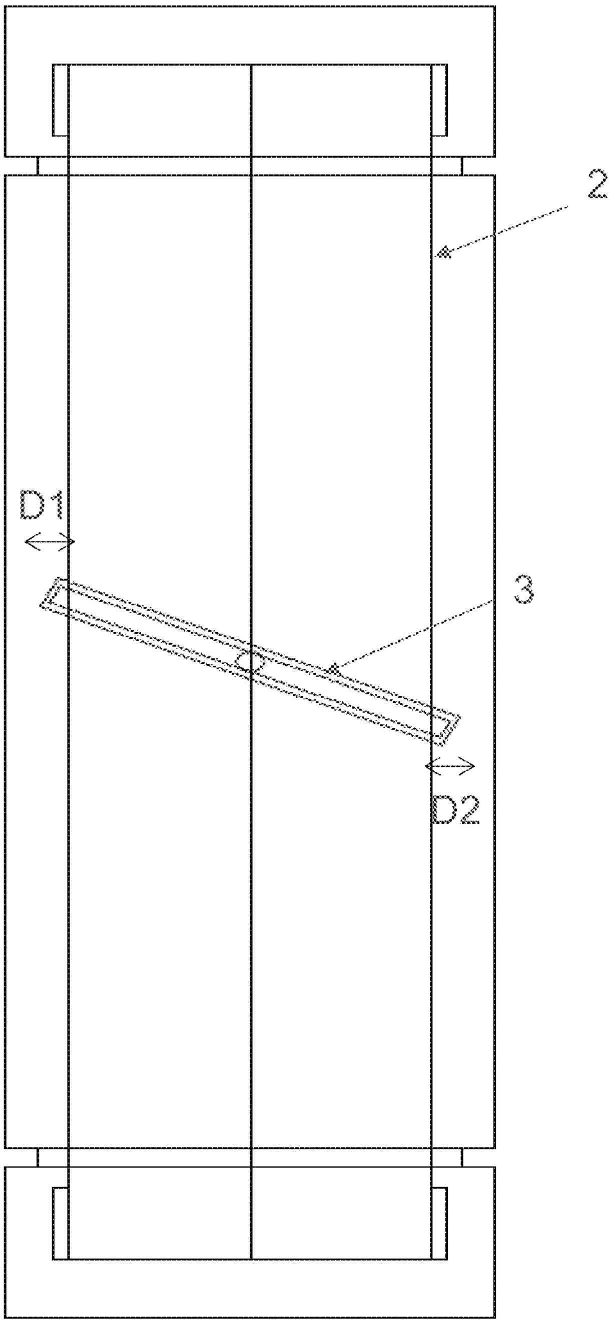
FIG. 2 illustrates a top view of a substrate coated with at least one vapor ejector inside a vacuum deposition facility according to the prior art.

According to the present invention, D1 and D2 are above 0 mm, i.e. the ejector edges do not go beyond the substrate edges. Without willing to be bound by any theory, it is believed that if D1 and D2 are equal or below to 0 mm, there is a risk that the trajectory of the metallic vapor ejected through the at least one vapor ejector is not controlled leading to an important contamination of the opposite side of the substrate S2. When D1 and D2 are below zero, it means that the edges of the vapor ejector extend beyond the substrate edges as illustrated in FIG. 2.

Preferably, D1 and D2 are independently from each other are above 1 mm, advantageously between 5 and 100 mm and more preferably between 30 and 70 mm.

In a preferred embodiment, D1 is identical to D2.

Preferably, the length of the ejector slot Le is between 5 and 50 mm

Preferably, the substrate width Ws is maximum of 2200 mm. Advantageously, Ws is minimum of 200 mm. For example, Ws is between 1000 and 1500 mm.

Preferably, We is maximum of 2400 mm. Advantageously, We is minimum of 400 mm.

In a preferred embodiment, Ws is smaller or equal to We.

Preferably, α in absolute value is above 0°, more preferably between 5 and 80°, advantageously between 20 and 60° in absolute terms and for example between 35 and 55° in absolute terms.

The vacuum chamber can comprise two or a several vapor ejectors all positioned on the same side of the running substrate S1.

Figure 3:
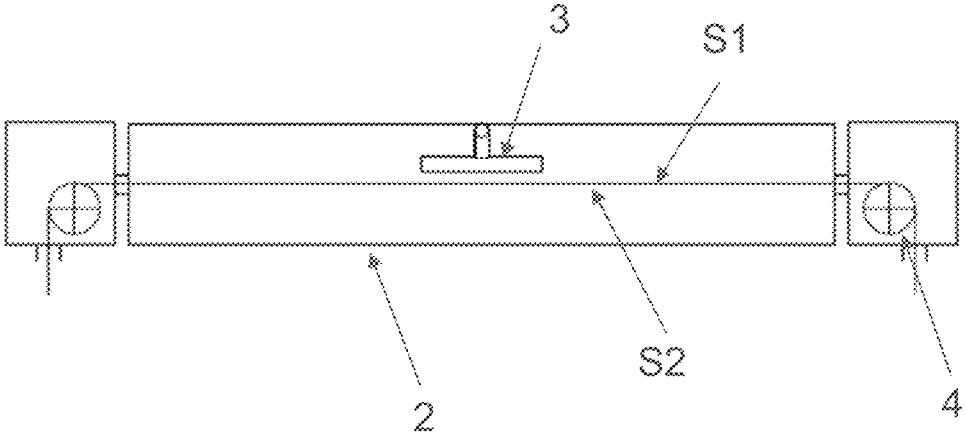
FIG. 3 illustrates a side view of a substrate coated with at least one metal inside a vacuum deposition facility according to the present invention.

As illustrated in FIG. 3, the substrate S may be made to run by any suitable means, depending on the nature and the shape of said substrate. A rotary support roller 4 on which a steel strip can bear may in particular be used.

Figure 4:
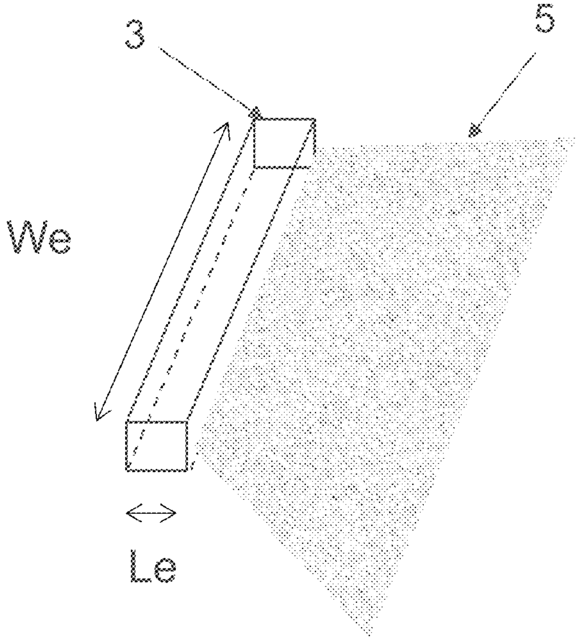
FIG. 4 illustrates an example of a vapor ejector ejecting a metallic vapor according to the present invention.

With reference to FIG. 4, the at least vapor ejector 3 according to the present invention ejects a metallic vapor jet 5 on the running substrate. The at least vapor ejector has an elongated shape and comprises a slot and is defined by a slot length Le and a slot width We.

In particular, with the method according to the present invention, it is possible to obtain a metallic substrate coated with at least one metal on one side of the substrate S1, the other substrate side S2 comprising a maximum accumulation of said metal of 2.0 μm on the edges. Preferably, the maximum accumulation is of 1 μm and advantageously, there is no accumulation of the metal on the opposite substrate side.

In the present invention, the at least one metal is preferably chosen among: zinc, chromium, nickel, titanium, manganese, magnesium, silicon, aluminum or a mixture thereof. Preferably, the metal is zinc with optionally magnesium.

Preferably, the metallic substrate is a steel substrate. Indeed, without willing to be bound by any theory, it is believed that the flatness is further improved when using steel substrate.

The thickness of the coating will preferably be between 0.1 and 20 μm. On one hand, below 0.1 μm, there would be a risk that the corrosion protection of the substrate would be insufficient. On the other hand, it is unnecessary to go beyond 20 μm in order to have the level of corrosion resistance which is required, in particular, in the automotive or construction field. In general, the thickness may be limited to 10 μm for automotive applications.

Finally, the invention relates to a Vacuum deposition facility for the method according to the present invention for continuously depositing, on a running substrate, coatings formed from at least one metal, the facility comprising a vacuum chamber through which the substrate can run along a given path, wherein the vacuum chamber further comprises:

the at least one vapor ejector being positioned with an angle α between the vapor ejector and the axis A perpendicular to the running direction of the substrate, the axis being in the plane of the substrate, α satisfying the following equation:

$$(D1+D2)+Le\sin\alpha+We\cos\alpha=Ws,$$

α in absolute value is above 0°,

D1 and D2 being the lowest distance between the ejector and each substrate edges along the axis (A), $W_s$ being the substrate width, D1 and D2 being above 0 mm and said at least one vapor ejector having an elongated shape and comprising a slot, such vapor ejector being defined by a slot length Le and a slot width We.

In a preferred embodiment, the at least one vapor jet coater is mounted to be able to rotate around a feeding pipe linked to a vapor source so that α is adjusted.

Examples

Tests have been performed on the vacuum deposition facility to assess the efficiency of the method comprising one jet vapor coater ejecting zinc vapor.

Zinc vapor was deposited on one side of the steel substrate S1 having a width Ws of 1200 mm in the vacuum chamber comprising the at least one ejector having Le=24 mm, We=1750 mm. For the Trials, D1 and D2 were identical and were fixed to be between −10 mm to +20 mm. −10 mm means that the edges of the vapor ejector exceed 10 mm beyond the edges of the substrate. α was calculated for each Trial with the equation according to the present invention. The vacuum pressure was of $10^{-1}$ mBar. The metal accumulation on the opposite side of the steel substrate S2 was measured by X-ray fluorescence spectrometry. The results are in the following Table 1:

| Trials | D1 = D2 (mm) | D1 and D2 > 0 mm | α (degrees) | α Satisfies the equation | Accumulation of zinc metal on the opposite side of the steel substrate S2 (μm) |
|---|---|---|---|---|---|
| 1 | −10 | No | 46.6 | Yes | 4.8 |
| 2 | 0 | No | 47.5 | Yes | 2.4 |
| 3* | +10 | Yes | 48.4 | Yes | 1.4 |
| 4* | +20 | Yes | 49.3 | Yes | 0.4 |

*according to the present invention

The accumulation of metal on the opposite side of the steel substrate S2 was high regarding Trials 1 and 2. On the contrary, as shown for Trials 3 and 4, when D1 and D2 are above 0 mm and when α satisfies the equation according to the present invention, the metal accumulation is significantly lower.

What is claimed is:

1. A coated metallic substrate comprising:

a metallic substrate having a first side, an opposite second side, and edges, the first side coated with a coating of at least one metal, a maximum accumulation of the at least one metal coated on the first side being 2.0 μm at the edges on the opposite second side, the coating being depositable by the steps of:

ejecting, in a vacuum chamber, a metallic vapor through at least one vapor ejector, towards one side of the metallic substrate running through the vacuum chamber, a layer of the at least one metal and formed on the side by condensation of ejected vapor, the at least one vapor ejector being positioned with an angle α between the vapor ejector and an axis perpendicular to a running direction of the substrate, the axis being in the plane of the substrate, α satisfying the following equation:

$$(D1+D2)+Le\sin\alpha+We\cos\alpha=Ws,$$

α being in absolute value above 0°,

D1 and D2 being defined as a distance between the ejector and each of the substrate edges along the axis, Ws being the substrate width, D1 and D2 being above 0 mm so the ejector edges do not extend beyond the substrate edges, the vapor ejector having an elongated shape and including a slot defined by a slot length Le and a slot width We.

2. The metallic substrate as recited in claim 1 wherein the at least one metal is chosen from: zinc, chromium, nickel, titanium, manganese, magnesium, silicon and aluminum or a mixture thereof.

3. The metallic substrate as recited in claim 1 wherein the metallic substrate is a steel substrate.

4. The metallic substrate as recited in claim 1 wherein the metallic substrate has a width of 1200 mm.

5. The metallic substrate as recited in claim 1 wherein a thickness of the coating on the first side is between 0.1 and 20 μm.

6. The metallic substrate as recited in claim 5 wherein the thickness is limited to 10 μm.

7. The metallic substrate as recited in claim 1 wherein the maximum accumulation is 1.4 μm.

8. The metallic substrate as recited in claim 1 wherein the maximum accumulation is 0.4 μm.

9. A vacuum deposition facility for continuously depositing, on the running substrate, the coatings formed from the at least one metal, the facility comprising:

a vacuum chamber, the substrate capable of running along a given path through the vacuum chamber, wherein the vacuum chamber further includes:

at least one vapor ejector being positioned with the angle α between the vapor ejector and an axis perpendicular to a running direction of the substrate, the axis being in the plane of the substrate, a satisfying the following equation:

$$(D1+D2)+Le\sin\alpha+We\cos\alpha=Ws,$$

α being in absolute value above 0°,

D1 and D2 being the distance between the ejector and each substrate edges along the axis and $W_s$ being the substrate width and D1 and D2 being above 0 mm so the ejector edges do not extend beyond the substrate edges, the at least one vapor ejector having the elongated shape and including the slot defined by the slot length Le and the slot width We.

10. The vacuum deposition facility as recited in claim 9 wherein the at least one vapor jet ejector is mounted to be able to rotate around a feeding pipe linked to a vapor source so that α is adjusted.

* * * * *